United States Patent [19]
Paulus

[11] Patent Number: 5,864,319
[45] Date of Patent: Jan. 26, 1999

[54] TESTING A BUILT-IN WINDSHIELD ANTENNA

[75] Inventor: Peter Paulus, Münster, Germany

[73] Assignee: Flachglas Automotive GmbH, Witten, Germany

[21] Appl. No.: 888,984

[22] Filed: Jul. 7, 1997

[30] Foreign Application Priority Data

Jul. 6, 1996 [DE] Germany .................. 196 27 391.9

[51] Int. Cl.⁶ ........................ G01R 31/02; H01Q 1/32
[52] U.S. Cl. ..................... 343/703; 343/713; 324/505
[58] Field of Search ........................ 343/703, 713, 343/704; 324/503, 505; H01Q 1/32; G01R 31/02

[56] References Cited

U.S. PATENT DOCUMENTS 4,276,509 6/1981 Bryant et al. ..................... 324/505
5,337,004 8/1994 Murakami et al. ................. 324/505

Primary Examiner—Hoanganh Le
Attorney, Agent, or Firm—Herbert Dubno; Andrew Wilford

[57] ABSTRACT

An antenna pane has a transparent sheet in which is imbedded a plurality of conductors at least some of which serve as antennas. It is tested by applying a test signal to one of the conductors and thereby transmitting the test signal from the one conductor, receiving the test signal with the other conductors serving as antennas, and evaluating the test signal received by the other conductors serving as antennas. The conductors serving as antennas of the pane are connected to a diversity processor and therethrough with a receiver. The test signal is produced by a signal generator operated by the diversity processor.

12 Claims, 1 Drawing Sheet

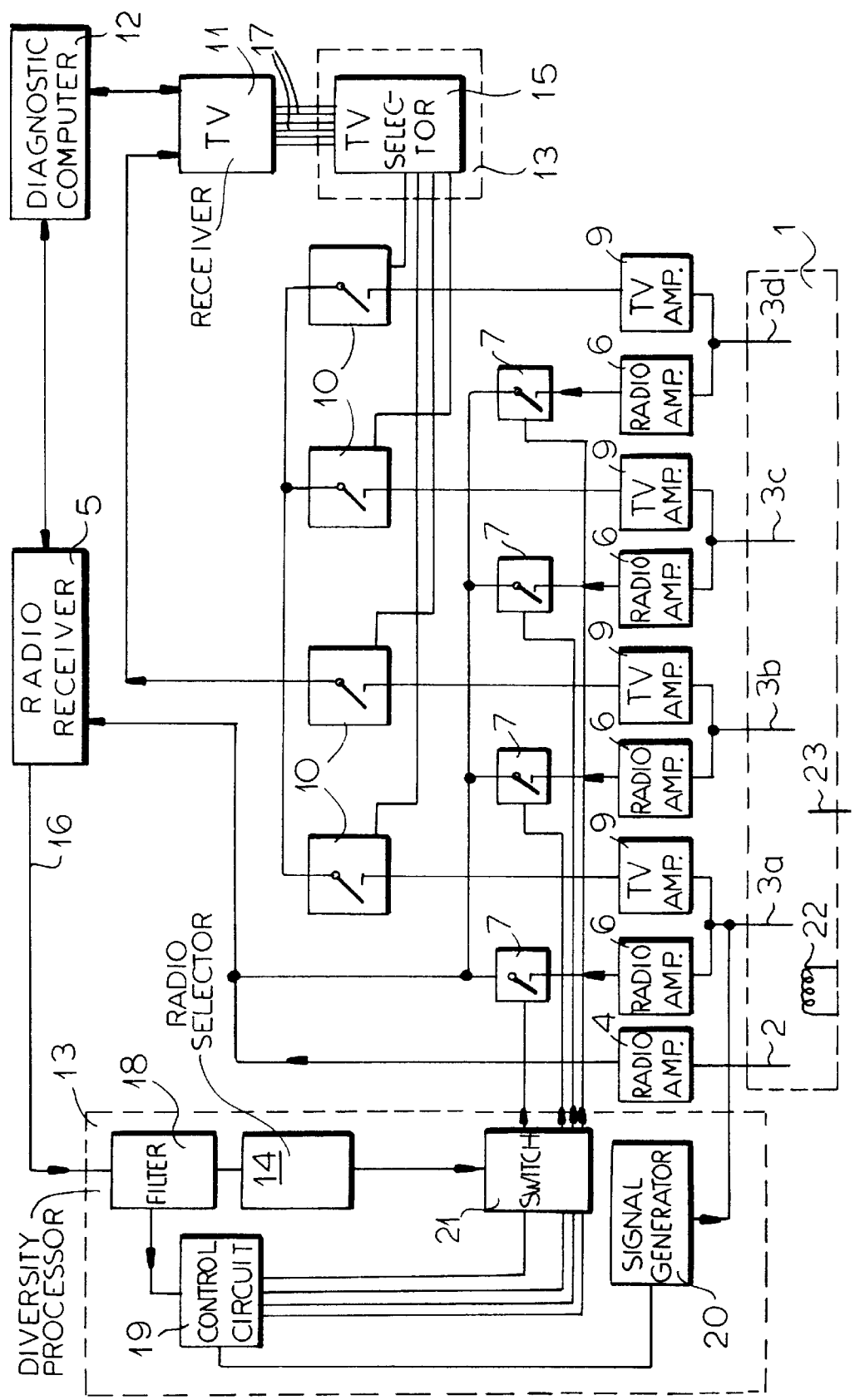

TESTING A BUILT-IN WINDSHIELD ANTENNA

FIELD OF THE INVENTION

The present invention relates to the testing of a built-in windshield antenna. More particularly this invention concerns a method of and apparatus for conducting such a test.

BACKGROUND OF THE INVENTION

A modern motor-vehicle windshield frequently incorporates at least one AM antenna and one or more radio and TV antennas and even a grid of heating wires. Becoming increasingly widespread are diversity systems, where several antennas for the same frequency range are present on one antenna pane. In diversity operation, a diversity processor selects the antenna which possesses the most favorable reception properties and connects it to the receiver.

With such complex antenna systems, numerous faults can occur. These may result from defects in the antenna conductors forming the antennas, defects in the antenna/amplifier connections, defects of the amplifier, defects of the diversity processor, and defects in the connection with the receiver. To permit clear identification of the exact source of the malfunction, various diagnostic methods are known.

One diagnostic method known in practice, with which defects in the antenna conductors in the antenna pane can be determined, a transmitting antenna is arranged close to the motor vehicle, or is attached to it externally, and a test signal is applied to this transmitting antenna. The resultant antenna signal occurring in the individual antennas of the antenna pane are acquired with the aid of a diagnostic arrangement and are evaluated. Reliable, reproducible diagnosis is only possible however if the transmitting antenna is located at all times at a precise, reproducible position relative to the antenna pane and in addition if parasitic signals can be excluded to a maximum extent. The provision of corresponding facilities and suitable transmitting antennas and diagnostic equipment will generally present problems, particularly for small motor-vehicle repair shops.

In addition it is also known to use an ohmmeter to measure the electrical continuity of an antenna conductor up to the amplifier input. This assumes that the beginning and the end of the antenna conductor are accessible. Another known alternative consists of connecting a signal generator to the antenna connection conductor which has been extended out of the motor-vehicle antenna pane, and to measure the signal emitted by the antenna to be tested with a meter, which is laid on the outside of antenna pane along the antenna conductors as described in U.S. Pat. No. 4,276,509.

OBJECTS OF THE INVENTION

It is therefore an object of the present invention to provide an improved system for testing an antenna pane.

Another object is the provision of such an improved system for testing an antenna pane which overcomes the above-given disadvantages, that is which is relatively simple so that it can even be used in a relatively small repair shop.

SUMMARY OF THE INVENTION

An antenna pane is comprised of a transparent sheet in which is imbedded a plurality of conductors at least some of which serve as antennas. It is tested by applying a test signal to one of the conductors and thereby transmitting the test signal from the one conductor, receiving the test signal with the other conductors serving as antennas, and evaluating the test signal received by the other conductors serving as antennas. The conductors serving as antennas of the pane are connected to a diversity processor and therethrough with a receiver. The test signal is produced by a signal generator operated by the diversity processor. This is possible because within a diversity processor there are already digital and/or analog circuits which can assume the function of switching the antennas over, as well as detecting a diagnostic mode. A signal generator can be integrated in this circuit without major expense.

The one conductor is galvanically separated from the other conductors. It can be a heating-wire grid. Normally according to the invention the one conductor serves as an antenna during normal operation of the antenna pane. In this case, the occurrence of a sufficiently high signal level in at least one of the other antennas can also lead to the conclusion that the transmitting antenna is free from defects, so that at the same time as diagnosis of the other antennas, self-diagnosis of the transmitting and receiving antennas takes place.

Optimization of the diagnostic method can be especially successful if the transmitting antenna is formed by an auxiliary antenna which is present and designed exclusively for diagnostic purposes, which is not therefore used for radio or TV reception. This auxiliary antenna should preferably be arranged and configured so that the test signal emitted by it is received approximately equally well by all antennas to be tested. Another, especially preferred alternative consists of using an existing AM conductor as transmitting antenna for testing the radio or TV antennas, thus at the same time for self-testing.

It is particularly desirable to match the test signal with the frequency range of the antennas to be tested. The frequency of the test signal can be set by a crystal, the receiver, or a computer and the control signal can be fed via an intermediate-frequency line or other control or the like to the antenna being energized for the test. If such a test signal is fed to the antenna in the antenna pane, due to the good coupling of the antennas therein between one another a defined signal will be produced which can be individually evaluated by the receiver if necessary together with the diversity processor according to the frequency band.

The test signal in accordance with the invention is preferably a steep-flank square wave. It is of course basically possible and desirable to tune the test signal as precisely as possible to the frequency ranges of the antennas to be tested. The rectangular-pulse signal which can for example possess a frequency of approximately 1 MHz, has harmonics which extend into the UHF range. The frequency can be defined by a quartz crystal, the receiver or a computer and transmitted by means of an intermediate frequency lead or other control or other leads to the transmitting antenna. If the test signal thus generated is applied to the transmitting antenna integrated in the antenna pane, the pronounced cross-coupling between the antennas produces a defined signal with components in all reception ranges that is generated in the other antennas. This signal can be evaluated by the receiver in diagnostic mode, separately by frequency band and antenna, if necessary in conjunction with the diversity processor.

Of course, the invention is described presently in its application to motor-vehicle antenna panes with radio and TV antennas. But of course, it is also possible to check other antennas, for example GPS antennas, mobile phone antennas, etc., with the diagnostic method according to the invention.

An apparatus according to the invention can test an antenna pane comprised of a transparent sheet in which is imbedded a plurality of conductors at least some of which serve as antennas and which are connected through respective switches operated by a diversity processor. The apparatus has according to the invention a signal generator connected to the diversity processor for applying a test signal to one of the conductors and thereby transmitting the test signal from the one conductor, and a receiver connected to the diversity processor for receiving the test signal with the other conductors serving as antennas and for evaluating the test signal received by the other conductors serving as antennas.

The apparatus further has according to the invention a control circuit connected between the receiver and the signal generator for selecting which of the other antennas to evaluate. In addition a diagnostic computer can be connected with the receiver or with the diversity processor.

BRIEF DESCRIPTION OF THE DRAWING

The above and other objects, features, and advantages will become more readily apparent from the following description, reference being made to the accompanying drawing whose sole FIGURE is a schematic diagram of the invention.

SPECIFIC DESCRIPTION

As seen in the drawing a motor vehicle antenna 1 incorporates an AM antenna 2 and several antennas 3a–d for radio and TV reception in diversity operation. It may also have a heating grid shown schematically at 22 and serving to defrost the windshield 1 and even a test antenna 23 whose purpose is described below. The AM antenna 2 is connected via an antenna amplifier 4 to a radio receiver 5. The antennas 3a–d are also connected for radio reception via appropriate amplifiers 6 and switches 7 to the radio receiver 5. For TV reception, the antennas 3a–d are additionally connected to a TV receiver 11 via appropriate TV amplifiers 9 and switches 10. Both receivers 5 and 11 can be connected to a diagnostic computer 12.

For radio and TV reception in diversity operation, at least one diversity processor 13 is provided. It has a radio section 14 that selects from the antennas 3a–d the one most suitable for radio reception and controls the switches 7 accordingly, so that the antenna selected from 3a–d is connected to the radio receiver 5. With its TV section 15 the processor 13 controls the switches 10 similarly. For this purpose, the radio section 14 of the diversity processor 13 is connected via a control line 16 to the radio receiver 5 and the TV section 15 via control lines 17 to the TV receiver 11.

For diagnostic purposes, the diversity processor 13 incorporates a separating filter 18 located in the control line 16, which relays a diagnostic control signal emitted by the radio receiver 5 to a control circuit 19 which is in turn connected to an antenna 3a equipped for diversity operation, functioning as transmitting antenna in diagnostic mode and which can alternately be connected to the heater grid 22 or the special-duty test antenna 23. In the case described, the transmitting antenna is in normal operation one of the antennas 3a–d for reception of radio or TV waves. The transmitting antenna could also be the AM antenna 2. In addition, the control logic 19 controls a change-over switch 21 from normal operation to diagnostic mode. This switch 21 is connected between the radio section 14 of the diversity processor 13 and the switches 7.

In the described embodiment the signal generator 20 supplies a steep-edged rectangular-pulse signal with a frequency of 1 MHz which possesses harmonics into the UHF range. This rectangular-pulse signal is applied to the antenna 3a of the antenna pane acting as transmitting antenna. On account of the pronounced cross-coupling of the antenna conductors 3a–d between one another, a defined signal with components in all reception ranges is generated in the other antenna conductors 3b–d, as well as in the AM antenna conductor. This signal can be tested separately in diagnostic mode, according to frequency band and antenna, by the receivers 5 and 11 in conjunction with the diversity processor 13, and can be analyzed in the diagnostic computer 12. A tested antenna is to be assessed as free from defects if the measured level of the test signal in this antenna lies above a predetermined threshold value.

Of course, according to the antenna and equipment configuration present and to be tested, there are a number of different alternatives for implementation of the invention. Thus for example, the software of the diagnostic computer 12 could assume one or more functions of the switches 7 and 10 or of the diversity processor 13. In addition, testing of the AM antenna 2 could also take place with the aid of a changeover switch assigned to the diversity processor 13, instead of a changeover switch located in the receiver 5, as in the example. It is also conceivable to operate several transmitting antennas in the antenna pane consecutively or simultaneously in order to further improve the quality of the diagnosis. Finally, it lies within the scope of the invention, in the case of vehicles with several antennas, to employ a transmitting antenna integrated in one of these antenna panes not only for diagnosis of the antennas of this antenna pane, but also for testing of the antennas of the other antenna panes in the event of adequate cross-coupling of the antennas with one another.

I claim:

1. A method of testing an antenna pane comprised of a transparent sheet in which is imbedded a plurality of conductors at least some of which serve as antennas, the method comprising the steps of:

applying a test signal to one of the conductors and thereby transmitting the test signal from the one conductor;

receiving the test signal with the other conductors serving as antennas; and evaluating the test signal received by the other conductors serving as antennas.

2. The antenna-pane testing method defined in claim 1 wherein the conductors serving as antennas of the pane are connected to a diversity processor and therethrough with a receiver, the method further comprising the step of producing the test signal with a signal generator operated by the diversity processor.

3. The antenna-pane testing method defined in claim 1 wherein the one conductor is galvanically separated from the other conductors.

4. The antenna-pane testing method defined in claim 1 wherein the one conductor is a heating-wire grid.

5. The antenna-pane testing method defined in claim 1 wherein the one conductor is a test antenna serving solely for testing the antenna pane.

6. The antenna-pane testing method defined in claim 1 wherein the one conductor serves as an antenna during normal operation of the antenna pane.

7. The antenna-pane testing method defined in claim 1 wherein the one conductor serves as an AM antenna.

8. The antenna-pane testing method defined in claim 1 wherein the signal is a steep-flank square wave.

9. An apparatus for testing an antenna pane comprised of a transparent sheet in which is imbedded a plurality of conductors at least some of which serve as antennas and which are connected through respective switches operated by a diversity processor, the apparatus comprising:

a signal generator connected to the diversity processor for applying a test signal to one of the conductors and thereby transmitting the test signal from the one conductor; and means including a receiver connected to the diversity processor for receiving the test signal with the other conductors serving as antennas and for evaluating the test signal received by the other conductors serving as antennas.

10. The testing apparatus defined in claim 9, further comprising means including a control circuit connected between the receiver and the signal generator for selecting which of the other antennas to evaluate.

11. The testing apparatus defined in claim 9, further comprising a diagnostic computer connected with the receiver.

12. The testing apparatus defined in claim 9, further comprising a diagnostic computer connected with the diversity processor.

* * * * *